United States Patent
Bae et al.

(10) Patent No.: US 11,923,292 B2
(45) Date of Patent: Mar. 5, 2024

(54) SEMICONDUCTOR DEVICE AND METHOD OF FABRICATING THE SAME

(71) Applicant: SAMSUNG ELECTRONICS CO., LTD., Suwon-si (KR)

(72) Inventors: Jinkuk Bae, Hwaseong-si (KR); Hyunsoo Chung, Hwaseong-si (KR); Inyoung Lee, Hwaseong-si (KR); Donghyeon Jang, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 298 days.

(21) Appl. No.: 17/307,212

(22) Filed: May 4, 2021

(65) Prior Publication Data

US 2021/0257294 A1   Aug. 19, 2021

Related U.S. Application Data

(63) Continuation of application No. 16/415,469, filed on May 17, 2019, now Pat. No. 11,024,575.

(30) Foreign Application Priority Data

Sep. 28, 2018   (KR) .................. 10-2018-0115972

(51) Int. Cl.
  *H01L 23/522* (2006.01)
  *H01L 21/768* (2006.01)
  (Continued)

(52) U.S. Cl.
  CPC .... *H01L 23/5226* (2013.01); *H01L 21/76873* (2013.01); *H01L 23/3128* (2013.01); *H01L 24/09* (2013.01); *H01L 24/17* (2013.01)

(58) Field of Classification Search
  CPC ............ H01L 23/5226; H01L 23/3128; H01L 21/76873; H01L 24/09; H01L 24/17
  (Continued)

(56) References Cited

U.S. PATENT DOCUMENTS 6,159,837 A    12/2000   Yamaji et al.
7,541,272 B2   6/2009    Daubenspeck et al.
(Continued)

FOREIGN PATENT DOCUMENTS

CN    106548997 A      3/2017
KR    10-2006-0074705 A   7/2006
(Continued)

OTHER PUBLICATIONS

Xiaowu Zhang et al. "Heterogeneous 2.5D integration on through silicon interposer" Applied Physics Reviews 2, 2015 (59 pages total).
(Continued)

*Primary Examiner* — Tu-Tu V Ho
(74) *Attorney, Agent, or Firm* — Sughrue Mion, PLLC

(57) ABSTRACT

A semiconductor device includes a semiconductor substrate, a conductive pad disposed on the semiconductor substrate, and a pillar pattern disposed on the conductive pad. The semiconductor device further includes a solder seed pattern disposed on the pillar pattern, and a solder portion disposed on the pillar pattern and the solder seed pattern. A first width of the solder seed pattern is less than a second width of a top surface of the pillar pattern.

17 Claims, 11 Drawing Sheets

(51) Int. Cl.
*H01L 23/00* (2006.01)
*H01L 23/31* (2006.01)
(58) Field of Classification Search
USPC .......................................................... 257/734
See application file for complete search history.

(56) References Cited

U.S. PATENT DOCUMENTS

| | | |
|---|---|---|
| 7,812,448 B2 | 10/2010 | Ramanathan et al. |
| 7,825,511 B2 | 11/2010 | Daubenspeck et al. |
| 8,994,173 B2 | 3/2015 | Daubenspeck et al. |
| 9,159,696 B2 | 10/2015 | Daubenspeck et al. |
| 9,478,510 B2 | 10/2016 | Jain |
| 9,831,202 B2 | 11/2017 | Seo et al. |
| 9,978,708 B2 | 5/2018 | Chen et al. |
| 10,020,273 B2 | 7/2018 | Choi et al. |
| 2008/0188071 A1 | 8/2008 | Lee et al. |
| 2008/0258305 A1 | 10/2008 | Lee et al. |
| 2015/0076688 A1 | 3/2015 | Daubenspeck et al. |
| 2015/0262951 A1 | 9/2015 | Lee et al. |
| 2017/0148753 A1 | 5/2017 | Choi et al. |
| 2018/0174990 A1 | 6/2018 | Park et al. |
| 2019/0148325 A1 | 5/2019 | Lu et al. |
| 2020/0035633 A1* | 1/2020 | Mishra .................... H01L 24/11 |

FOREIGN PATENT DOCUMENTS

| | | |
|---|---|---|
| KR | 10-0897822 B1 | 5/2009 |
| KR | 10-2010-0120501 A | 11/2010 |
| KR | 10-2014-0001682 A | 1/2014 |
| KR | 20170058680 A | 5/2017 |

OTHER PUBLICATIONS

Advacam "Soulutions for flip chip bonding of future pixel detectors" Vertex, 2017 (36 pages total).

* cited by examiner

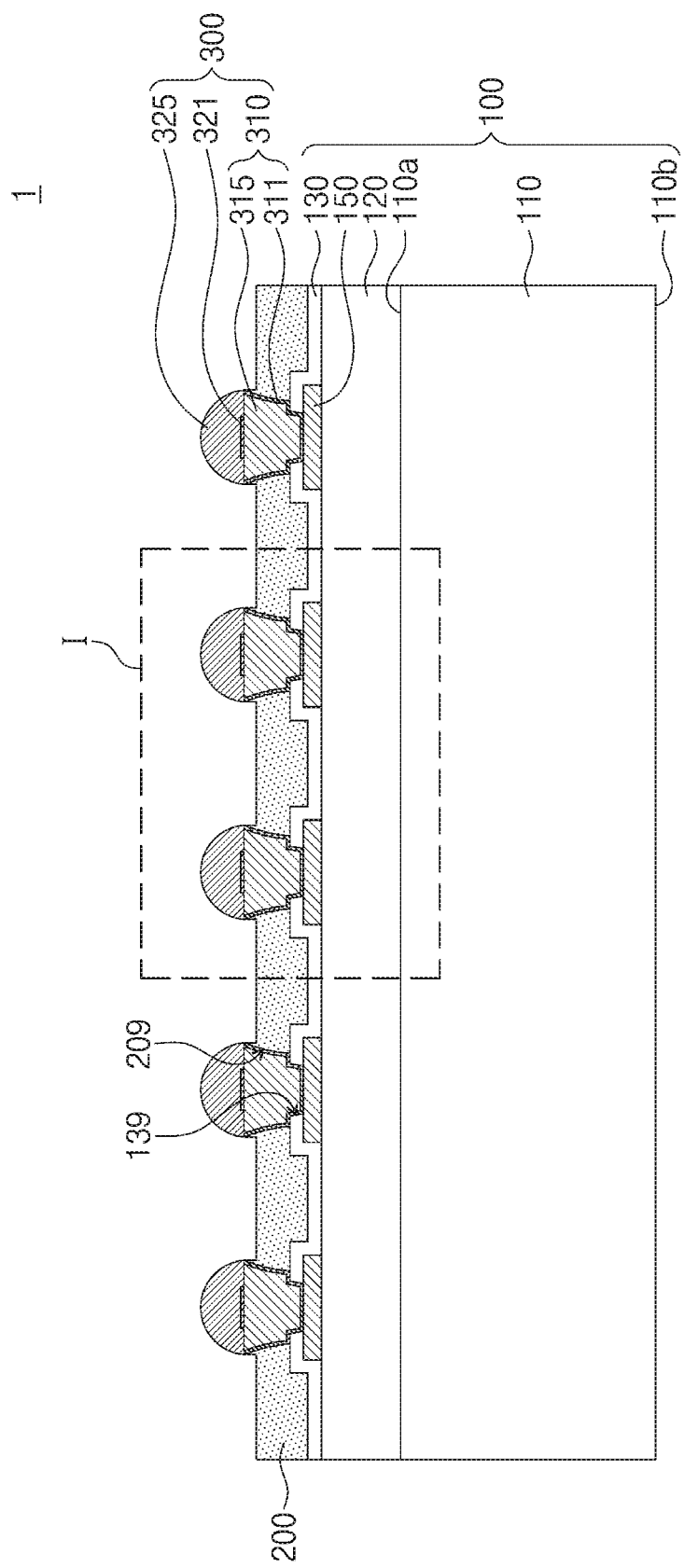

US 11,923,292 B2

SEMICONDUCTOR DEVICE AND METHOD OF FABRICATING THE SAME

CROSS-REFERENCE TO THE RELATED APPLICATION

This is a continuation application of U.S. patent application Ser. No. 16/415,469, filed May 17, 2019, in the U.S. Patent and Trademark Office, which claims priority from Korean Patent Application No. 10-2018-0115972, filed on Sep. 28, 2018, in the Korean Intellectual Property Office, the disclosure of which is incorporated herein by reference in its entirety.

BACKGROUND

Apparatuses and methods consistent with embodiments relate to a semiconductor device and, more particularly, to a semiconductor device having a connection terminal and a method of fabricating the same.

The number of electrode terminals of a semiconductor device has been increased and a pitch of the electrode terminals has been reduced. Thus, various methods of highly integrating a semiconductor device are being studied. A semiconductor device may have electrical connection terminals (e.g., solder balls or bumps) to be electrically connected to another electronic device and/or a printed circuit board. A pitch of connection terminals of a semiconductor device may need to be reduced.

SUMMARY

According to embodiments, a semiconductor device includes a semiconductor substrate, a conductive pad disposed on the semiconductor substrate, and a pillar pattern disposed on the conductive pad. The semiconductor device further includes a solder seed pattern disposed on the pillar pattern, and a solder portion disposed on the pillar pattern and the solder seed pattern. A first width of the solder seed pattern is less than a second width of a top surface of the pillar pattern.

According to embodiments, a semiconductor device includes a semiconductor substrate, a conductive pad disposed on the semiconductor substrate, and a pillar pattern disposed on the conductive pad. The semiconductor device further includes a solder seed pattern disposed on the pillar pattern, and a solder portion covering a first sidewall of the solder seed pattern and the top surface of the edge region of the pillar pattern.

According to embodiments, a semiconductor device comprising: a semiconductor substrate; a plurality of conductive pad disposed on the semiconductor substrate; a plurality of connection terminals disposed on the substrate; and a polymer layer disposed between the connection terminals on the semiconductor substrate, wherein each of the connection terminals comprises: a pillar pattern disposed on corresponding one of the conductive pads; a solder seed pattern disposed on the pillar pattern; and a solder portion covering a first sidewall of the solder seed pattern and a top surface of an edge region of the pillar pattern.

According to embodiments, a method of fabricating a semiconductor device, includes preparing a semiconductor substrate, forming a conductive pad on the semiconductor substrate, and forming a pillar pattern on the conductive pad. The method further includes forming a solder seed layer on the pillar pattern, forming a preliminary solder portion on a first portion of the solder seed layer, and removing a second portion of the solder seed layer, on which the preliminary solder portion is not formed, the second portion remaining from the first portion of the solder seed layer, to form a solder seed pattern. The method further includes performing a reflow process on the preliminary solder portion to form a solder portion covering a sidewall of the solder seed pattern and a top surface of an edge region of the pillar pattern.

BRIEF DESCRIPTION OF THE DRAWINGS

FIG. 1A is a cross-sectional view illustrating a semiconductor device according to embodiments of the inventive concepts.

DETAILED DESCRIPTION OF THE EMBODIMENTS

Figure 1B:
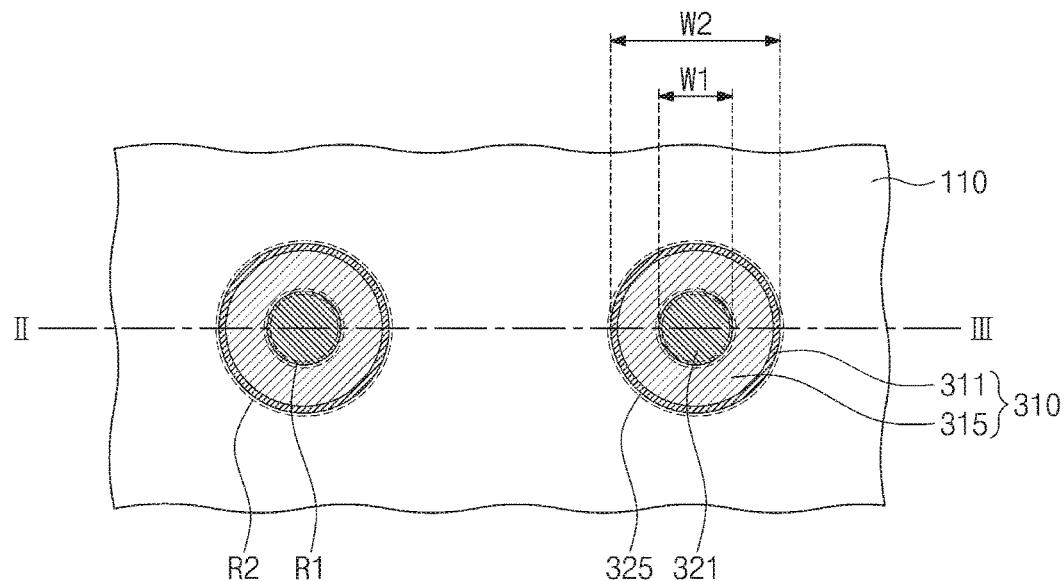
FIG. 1B is a plan view illustrating a connection terminal of a semiconductor device according to embodiments of the inventive concepts.

Embodiments of the inventive concepts may provide a semiconductor device including connection terminals having a fine pitch and a method of fabricating the same.

The same reference numerals or the same reference designators may denote the same elements or components throughout the specification.

Figure 1C:
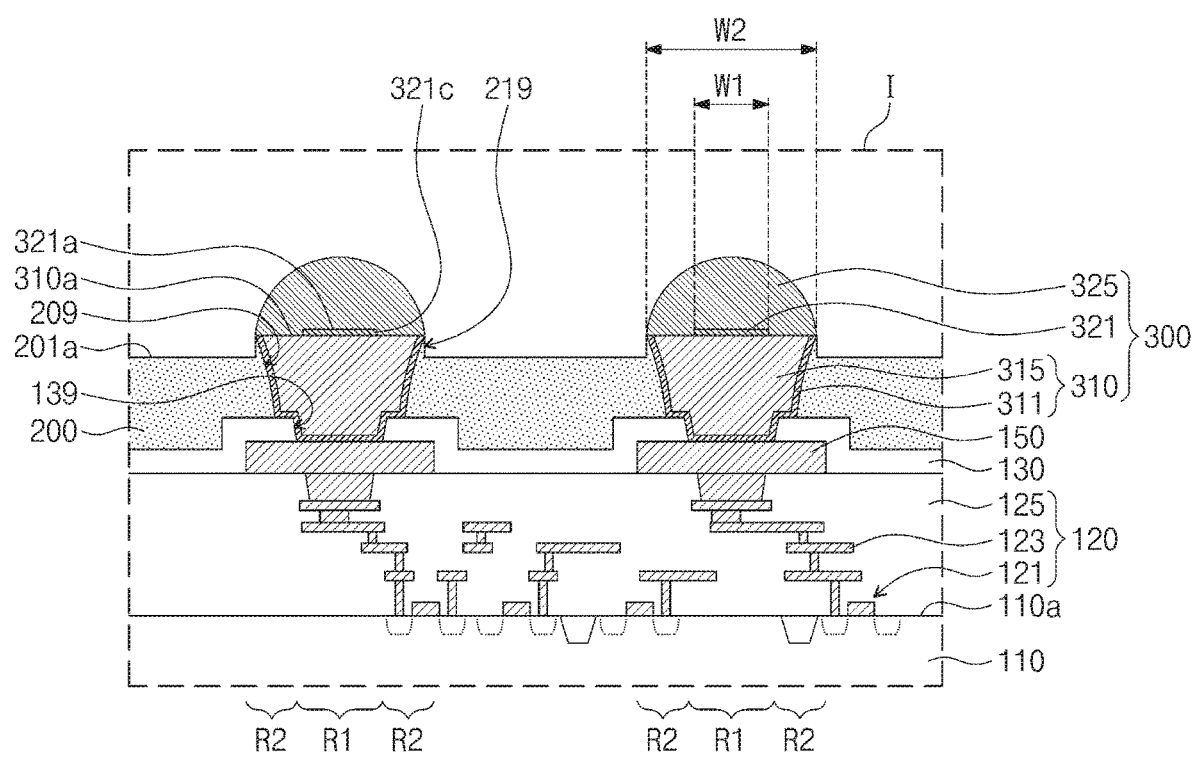
FIG. 1C is an enlarged view of a region 'I' of FIG. 1A.

FIG. 1A is a cross-sectional view illustrating a semiconductor device according to embodiments of the inventive concepts. FIG. 1B is a plan view illustrating a connection terminal of a semiconductor device according to embodiments of the inventive concepts. FIG. 1C is an enlarged view of a region 'I' of FIG. 1A and corresponds to a cross-sectional view taken along a line II-III of FIG. 1B.

Referring to FIGS. 1A, 1B and 1C, a semiconductor device 1 may include a semiconductor chip 100 and connection terminals 300. The semiconductor chip 100 may be a memory chip or a logic chip. The semiconductor chip 100 may include a semiconductor substrate 110, a circuit layer 120, a protective layer 130, and conductive pads 150. For example, the semiconductor substrate 110 may include a semiconductor material such as silicon, germanium, or silicon-germanium. The circuit layer 120 may be provided on a first surface 110a of the semiconductor substrate 110. The circuit layer 120 may include integrated circuits 121, internal interconnection lines 123, and an insulating layer 125, as illustrated in FIG. 1C. The integrated circuits 121 may be provided on the first surface 110a of the semiconductor substrate 110. For example, the integrated circuits 121 may include transistors. The insulating layer 125 may be provided on the first surface 110a of the semiconductor substrate 110 and may cover the integrated circuits 121. The insulating layer 125 may include a plurality of layers. The internal interconnection lines 123 may be provided in the insulating layer 125. The internal interconnection lines 123 may be electrically connected to the integrated circuits 121. It will be understood that when an element is referred to as being electrically connected to the semiconductor chip 100, it may be electrically connected to the integrated circuits 121 of the semiconductor chip 100. In addition, it will be understood that when an element is referred to as being "electrically connected" to another element, it may be connected directly to the other element or intervening elements may be present.

The conductive pads 150 may be provided on the first surface 110a of the semiconductor substrate 110. For example, the conductive pads 150 may be provided on the circuit layer 120. In the present specification, it will be understood that when an element is referred to as being "on" another element, it may be directly on the other element or intervening elements may be present. The conductive pads 150 may include a metal such as aluminum or copper. The conductive pads 150 may be electrically connected to the integrated circuits 121 through the internal interconnection lines 123. The conductive pads 150 may be chip pads.

Unlike FIG. 1A, the circuit layer 120 may be provided on a second surface 110b of the semiconductor substrate 110. The second surface 110b of the semiconductor substrate 110 may be opposite to the first surface 110a. In this case, through-electrodes may be provided in the semiconductor substrate 110 to connect the internal interconnection lines 123 to the conductive pads 150. The conductive pads 150 may be electrically connected to the integrated circuits 121 through the through-electrodes and the internal interconnection lines 123. The insulating layer 125, the integrated circuits 121 and the internal interconnection lines 123 are omitted in other drawings except FIG. 1C for the purpose of ease and convenience in illustration and explanation.

The protective layer 130 may be provided on the first surface 110a of the semiconductor substrate 110. The protective layer 130 may cover the circuit layer 120. The protective layer 130 may have pad openings 139, and the pad openings 139 may expose top surfaces of the conductive pads 150, respectively. The protective layer 130 may extend onto an edge region of the conductive pad 150 to cover a portion of the top surface of the conductive pad 150 and a sidewall of the conductive pad 150. The portion of the top surface of the conductive pad 150 may be adjacent to the sidewall of the conductive pad 150. For example, the protective layer 130 may include a silicon-containing insulating material such as silicon oxide, silicon nitride, silicon oxynitride, and/or tetraethyl orthosilicate (TEOS). For another example, the protective layer 130 may include an insulating polymer. The protective layer 130 may be a multi-layer including a plurality of layers and each of the plurality of layers may include silicon oxide, silicon nitride, silicon oxynitride, and/or tetraethyl orthosilicate (TEOS)

A polymer layer 200 may be provided on the first surface 110a of the semiconductor substrate 110. For example, the polymer layer 200 may cover the protective layer 130. The polymer layer 200 may have openings 209, and the openings 209 may expose the conductive pads 150, respectively. Each of the openings 209 of the polymer layer 200 may be connected to a corresponding one of the pad openings 139 of the protective layer 130. The polymer layer 200 may include an insulating polymer. The polymer layer 200 may have a recessed portion 219, as illustrated in FIG. 1C. A top surface 201a of the polymer layer 200 may be disposed at a lower level than a top surface 310a of a pillar pattern 310.

The connection terminals 300 may be provided on the conductive pads 150 to be connected to the conductive pads 150, respectively. Each of the connection terminals 300 may include the pillar pattern 310, a solder seed pattern 321, and a solder portion 325. The pillar pattern 310 may include a pillar seed pattern 311 and a conductive pattern 315. The pillar pattern 310 may be provided in the opening 209. At least a portion of the pillar pattern 310 may be surrounded by the polymer layer 200. The pillar seed pattern 311 may be disposed between the conductive pad 150 and the conductive pattern 315, between the protective layer 130 and the conductive pattern 315, and between the polymer layer 200 and the conductive pattern 315. That is, the pillar seed pattern 311 may extend onto a sidewall (a second sidewall) of the conductive pattern 315. The pillar pattern 310 may have a first region R1 and a second region R2 when viewed in a plan view, as illustrated in FIG. 1B. The second region R2 of the pillar pattern 310 may correspond to an edge region of the pillar pattern 310. The second region R2 of the pillar pattern 310 may surround the first region R1 of the pillar pattern 310 when viewed in a plan view. The first region R1 of the pillar pattern 310 may correspond to, but not limited to, a central region of the pillar pattern 310.

The solder seed pattern 321 may be provided on the top surface 310a of the pillar pattern 310. A diameter (a first diameter) of the solder seed pattern 321 may be less than a diameter (a second diameter) of the top surface 310a of the pillar pattern 310. A width W1 (a first width) of the solder seed pattern 321 may be less than a width W2 (a second width) of the top surface 310a of the pillar pattern 310. The solder seed pattern 321 may cover the top surface 310a of the first region R1 of the pillar pattern 310 but may expose the top surface 310a of the second region R2 of the pillar pattern 310. The solder seed pattern 321 may not extend onto the top surface 201a of the polymer layer 200.

The solder portion 325 may be provided on the solder seed pattern 321 and may cover the exposed top surface 310a of the second region R2 of the pillar pattern 310. The solder portion 325 may seal a top surface 321a and a sidewall 321c (a first sidewall) of the solder seed pattern 321. The sidewall 321c of the solder seed pattern 321 may be covered by the solder portion 325 and thus may not be exposed to the outside. The connection terminals 300 may have a fine pitch. Hereinafter, the connection terminals 300 will be described in more detail in descriptions to a method of fabricating the semiconductor device 1.

FIGS. 2A, 2B, 2C, 2D, 2E, 2F, 2G, 2H, 2I, 2J and 2K are views illustrating a method of fabricating a semiconductor device, according to embodiments of the inventive concepts. FIGS. 2A to 2K correspond to enlarged views of the region T of FIG. 1A and cross-sectional views taken along the line II-III of FIG. 1B. Hereinafter, the descriptions to the same features as mentioned above will be omitted or mentioned briefly for the purpose of ease and convenience in explanation.

Figure 2A:
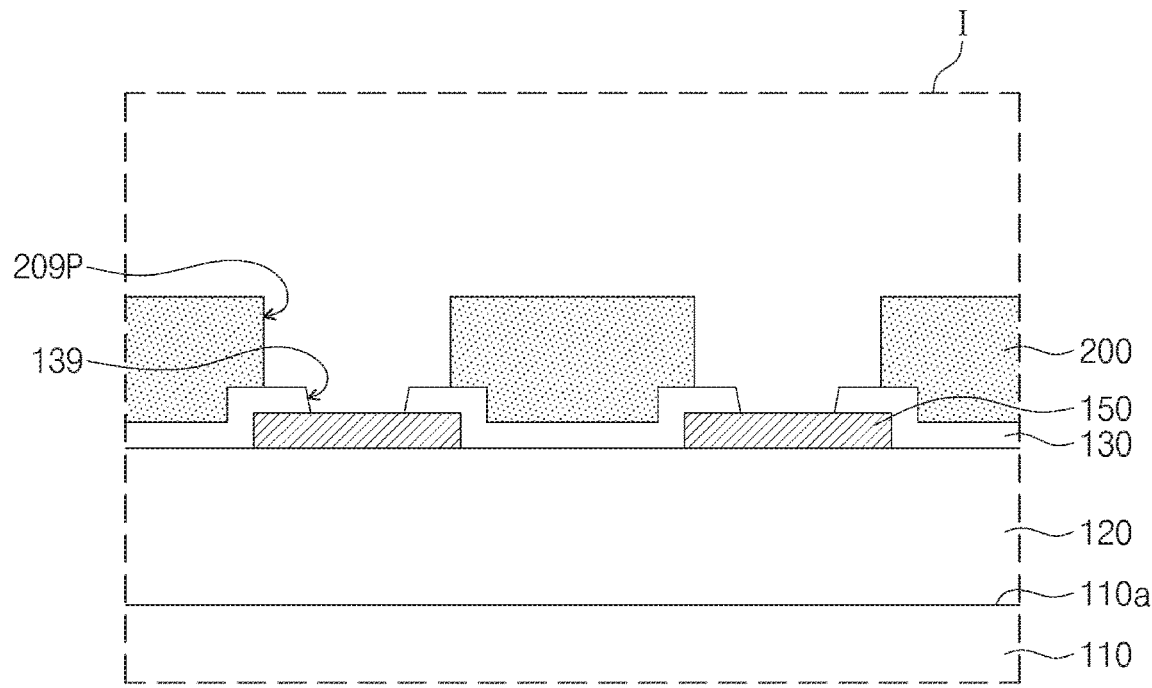
FIGS. 2A, 2B, 2C, 2D, 2E, 2F, 2G, 2H, 2I, 2J and 2K are views illustrating a method of fabricating a semiconductor device, according to embodiments of the inventive concepts.

Referring to FIGS. 1A, 1B and 2A, a semiconductor chip 100 may be prepared. A circuit layer 120, conductive pads 150 and a protective layer 130 may be formed on a semiconductor substrate 110 to fabricate the semiconductor chip 100.

A polymer layer 200 may be formed on the first surface 110a of the semiconductor substrate 110 to cover the protective layer 130. The polymer layer 200 may include an insulating polymer. The polymer layer 200 may be formed by a coating process. The polymer layer 200 may be patterned to form preliminary openings 209P in the polymer layer 200. The polymer layer 200 may be patterned using an etching process such as a dry etching process. The etching process may be performed until the preliminary openings 209P expose the conductive pads 150. The preliminary openings 209P may be connected to the pad openings 139 to expose the conductive pads 150, respectively. The preliminary openings 209P may have sidewalls substantially perpendicular to the first surface 110a of the semiconductor substrate 110. For example, a width of an upper portion of the preliminary opening 209P may be substantially equal to a width of a lower portion of the preliminary opening 209P.

Figure 2B:
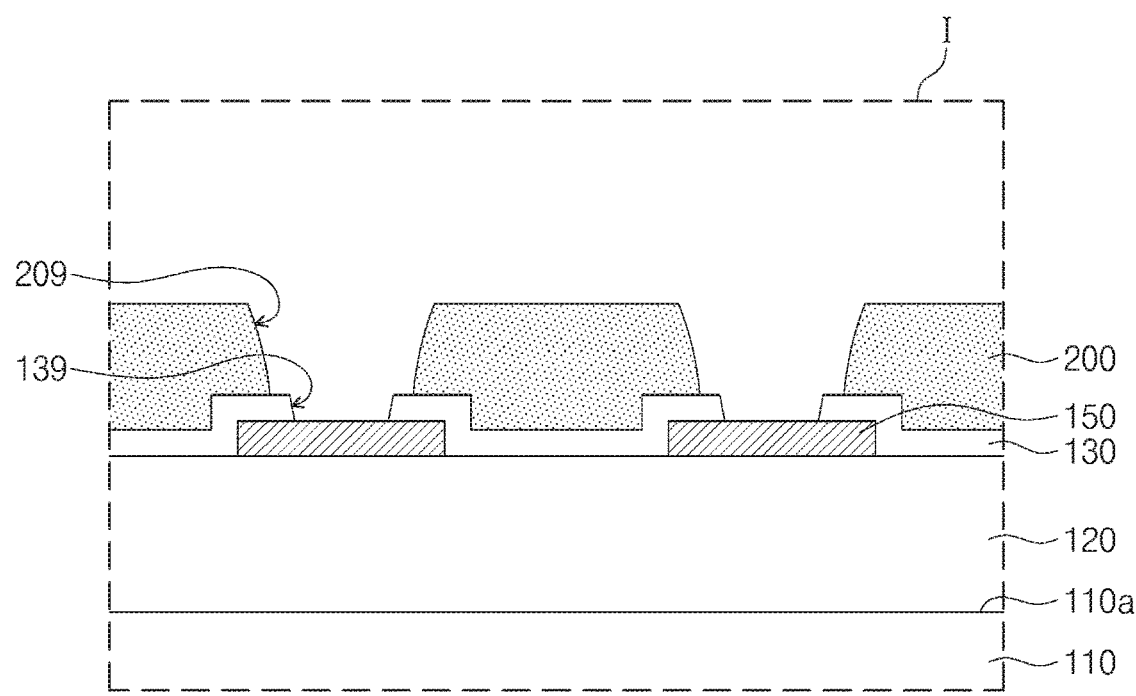

Referring to FIGS. 1A, 1B and 2B, the polymer layer 200 may be hardened to form openings 209. The polymer layer 200 may be hardened by a heat hardening process. During the heat hardening process, a portion of the polymer layer 200 may flow into the preliminary openings 209P to form the openings 209. The openings 209 may have tapered shapes. For example, a diameter of an upper portion of the opening 209 may be greater than a diameter of a lower portion of the opening 209. A width of the upper portion of the opening 209 may be greater than a width of the lower portion of the opening 209. At this time, the lower portion of the opening 209 may be adjacent to the conductive pad 150. In other words, the lower portion of the opening 209 may be disposed between the upper portion of the opening 209 and the conductive pad 150. The opening 209 may further expose a portion of the protective layer 130, and the exposed portion of the protective layer 130 may be adjacent to the conductive pad 150.

Figure 2C:
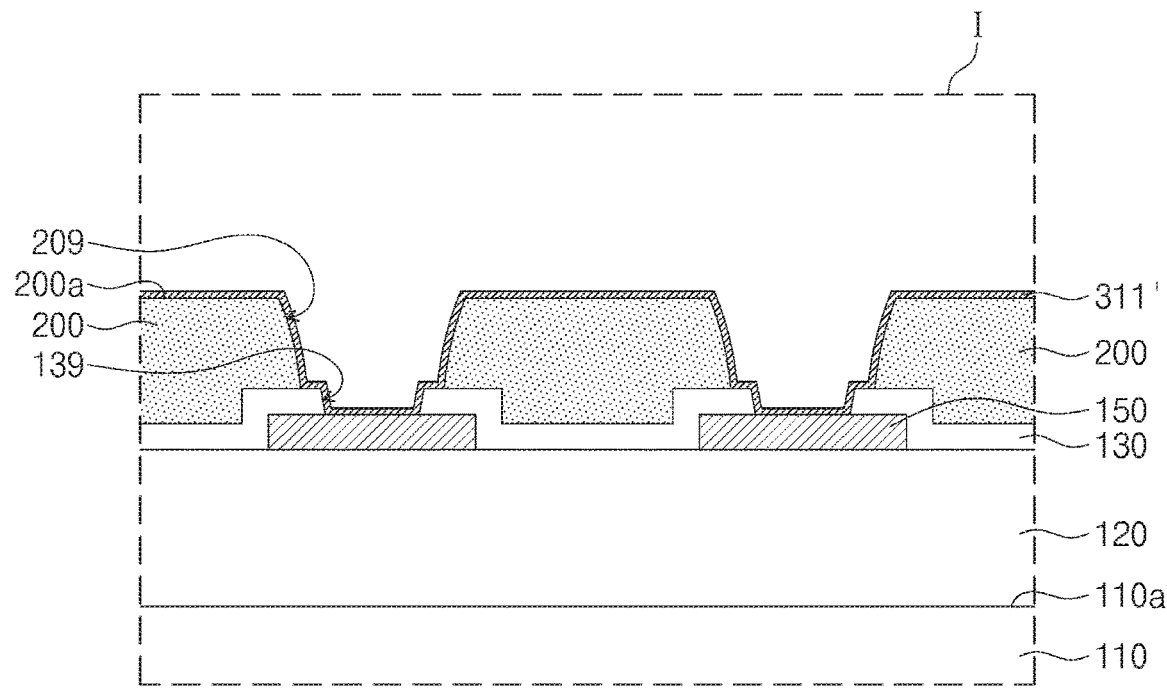

Referring to FIGS. 1A, 1B and 2C, a pillar seed layer 311' may be conformally formed on the polymer layer 200 and in the pad openings 139 and the openings 209. The pillar seed layer 311' may cover the conductive pad 150 and the protective layer 130 exposed by the opening 209 and may extend onto an inner sidewall and a top surface 200a of the polymer layer 200. The pillar seed layer 311' may be formed by a deposition process. The pillar seed layer 311' may include a conductive material. For example, the pillar seed layer 311' may include either one or both of copper (Cu) titanium (Ti).

Figure 2D:
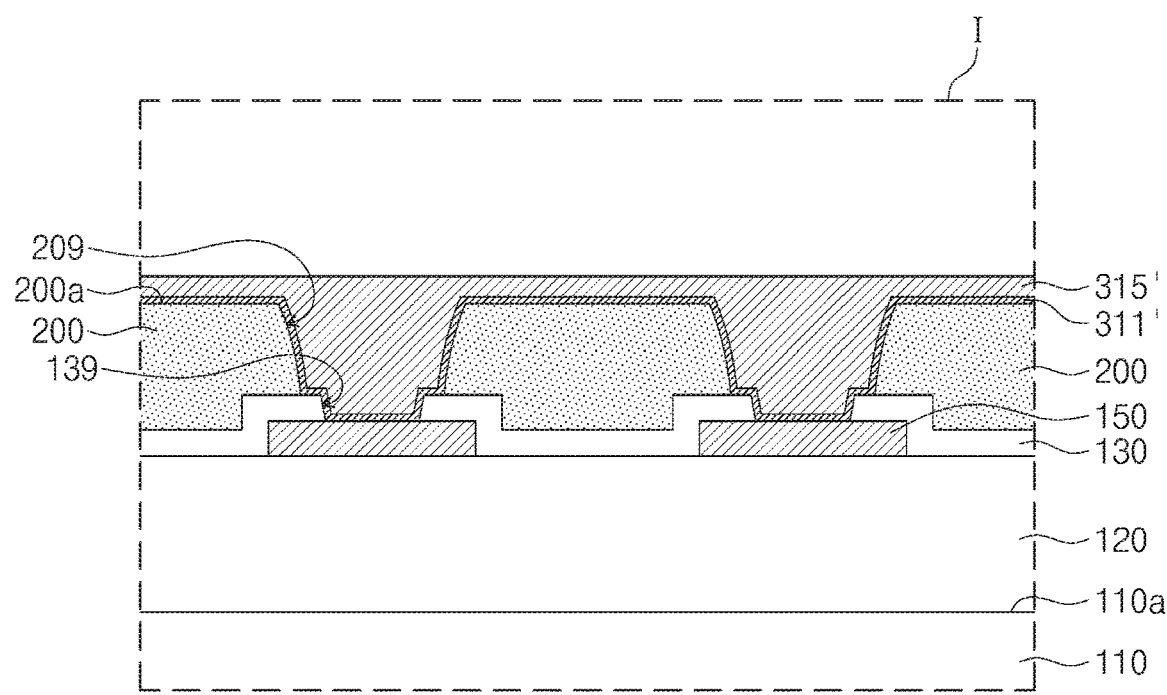

Referring to FIGS. 1A, 1B and 2D, a conductive layer 315' may be formed by performing an electroplating process using the pillar seed layer 311' as an electrode. The conductive layer 315' may cover the pillar seed layer 311'. The conductive layer 315' may fill the pad openings 139 and the openings 209 and may extend onto the top surface 200a of the polymer layer 200. The conductive layer 315' may include the same material as the pillar seed layer 311'. For example, the conductive layer 315' may include a metal such as copper.

Figure 2E:
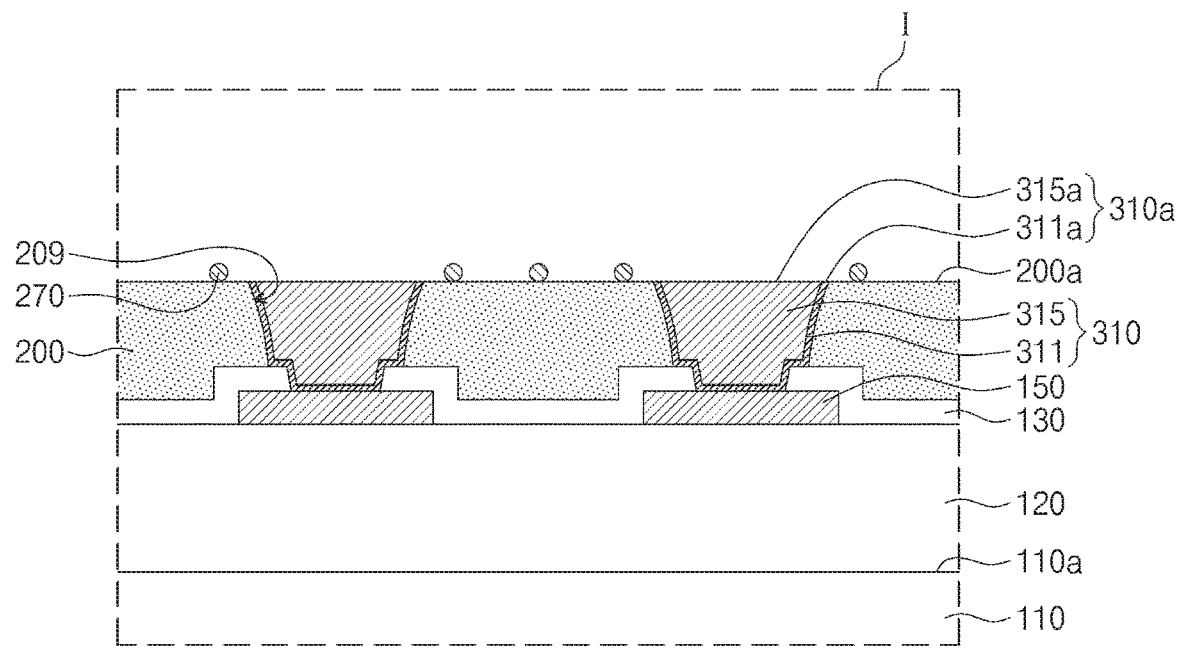

Referring to FIGS. 1A, 1B and 2E, the conductive layer 315' and the pillar seed layer 311' may be planarized to form pillar patterns 310 in the openings 209, respectively. Each of the pillar patterns 310 may include a conductive pattern 315 and a pillar seed pattern 311. The conductive pattern 315 may be formed by planarizing the conductive layer 315', and the pillar seed pattern 311 may be formed by planarizing the pillar seed layer 311'. The pillar patterns 310 may be separated from each other. The planarization process may be performed by a chemical mechanical polishing (CMP) process. The conductive layer 315' and the pillar seed layer 311' on the top surface 200a of the polymer layer 200 may be removed by the planarization process to expose the top surface 200a of the polymer layer 200. Thus, the pillar patterns 310 may be electrically isolated from each other. After the planarization process, a topmost surface 311a of the pillar seed pattern 311 may be exposed by the polymer layer 200 and the conductive pattern 315.

Heights of the pillar patterns 310 may be substantially uniform by the planarization process of the conductive layer 315' and the pillar seed layer 311'. For example, top surfaces 310a of the pillar patterns 310 may be disposed at the same or similar levels. The top surface 310a of each of the pillar patterns 310 may include a top surface 315a of the conductive pattern 315 and the topmost surface 311a of the pillar seed pattern 311.

According to the embodiments of the inventive concepts, the pillar patterns 310 may be formed by a damascene process. For example, the formation of the pillar patterns 310 may include forming the pillar seed layer 311' and the conductive layer 315' in the openings 209 of the polymer layer 200, and performing the planarization process on the conductive layer 315' and the pillar seed layer 311' to locally form the pillar patterns 310 in the openings 209, respectively. Thus, an additional etching process for electrically isolating the pillar patterns 310 from each other may be omitted. As a result, it is possible to prevent an undercut from occurring at sidewalls of the pillar patterns 310 by an etching process. Hereinafter, a singular pillar pattern 310 will be mainly described.

The pillar pattern 310 may have a shape corresponding to a shape of the opening 209. For example, a cross section of the pillar pattern 310 may have a tapered shape. A width (a third width) of an upper portion of the pillar pattern 310 may be greater than a width (a fourth width) of a lower portion of the pillar pattern 310. A diameter of the upper portion of the pillar pattern 310 may be greater than a diameter of the lower portion of the pillar pattern 310. The lower portion of the pillar pattern 310 may be adjacent to the conductive pad 150. In other words, the lower portion of the pillar pattern 310 may be disposed between the upper portion of the pillar pattern 310 and the conductive pad 150.

After the planarization process, a conductive residue 270 may remain on the top surface 200a of the polymer layer 200. The conductive residue 270 may be a residue of the pillar seed layer 311' or a residue of the conductive layer 315'.

Figure 2F:
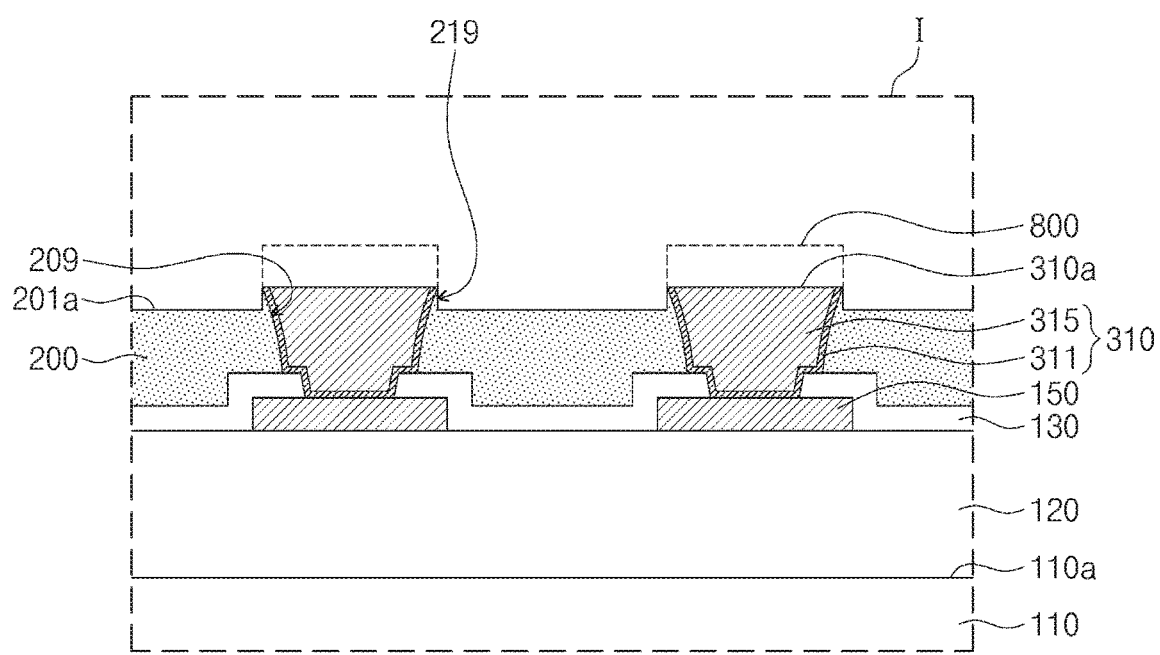

Referring to FIG. 2F, the conductive residue 270 may be removed by an etching process. In embodiments, a mask pattern 800 illustrated by a dotted line may be formed on the pillar pattern 310. The mask pattern 800 may not extend onto the polymer layer 200. Thereafter, an etching process may be performed on the polymer layer 200 to remove the conductive residue 270. For example, the etching process may include a wet etching process. At this time, a portion of the polymer layer 200 may also be removed by the etching process. Thus, the polymer layer 200 may have a recessed portion 219. Due to the mask pattern 800, the pillar pattern 310 may not be exposed to the etching process. A recessed top surface 201a of the polymer layer 200 may be disposed at a lower level than the top surface 310a of the pillar pattern 310. After the etching process, the mask pattern 800 may be removed.

Figure 2G:
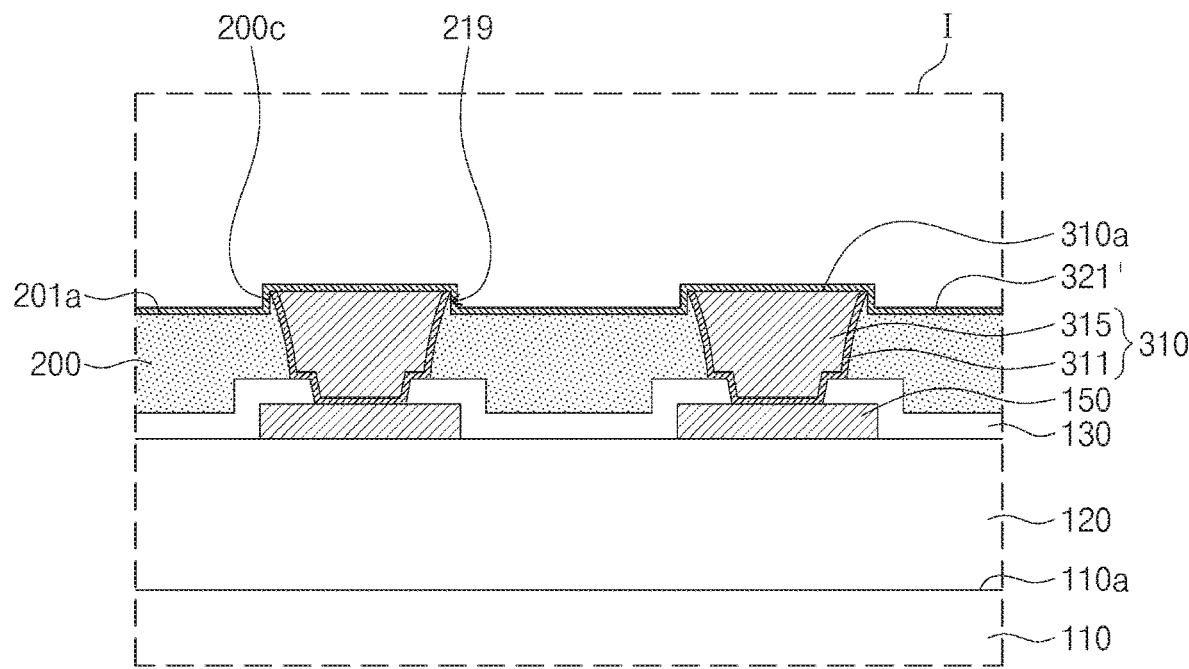

Referring to FIG. 2G, a solder seed layer 321' may be formed on the pillar pattern 310 and the polymer layer 200. The solder seed layer 321' may conformally cover the top surface 310a of the pillar pattern 310 and the top surface 201a and a sidewall 200c of the polymer layer 200. The solder seed layer 321' may be formed by a deposition process. The solder seed layer 321' may include a metal. For example, the solder seed layer 321' may include either one or both of copper (Cu) and titanium (Ti).

Figure 2H:
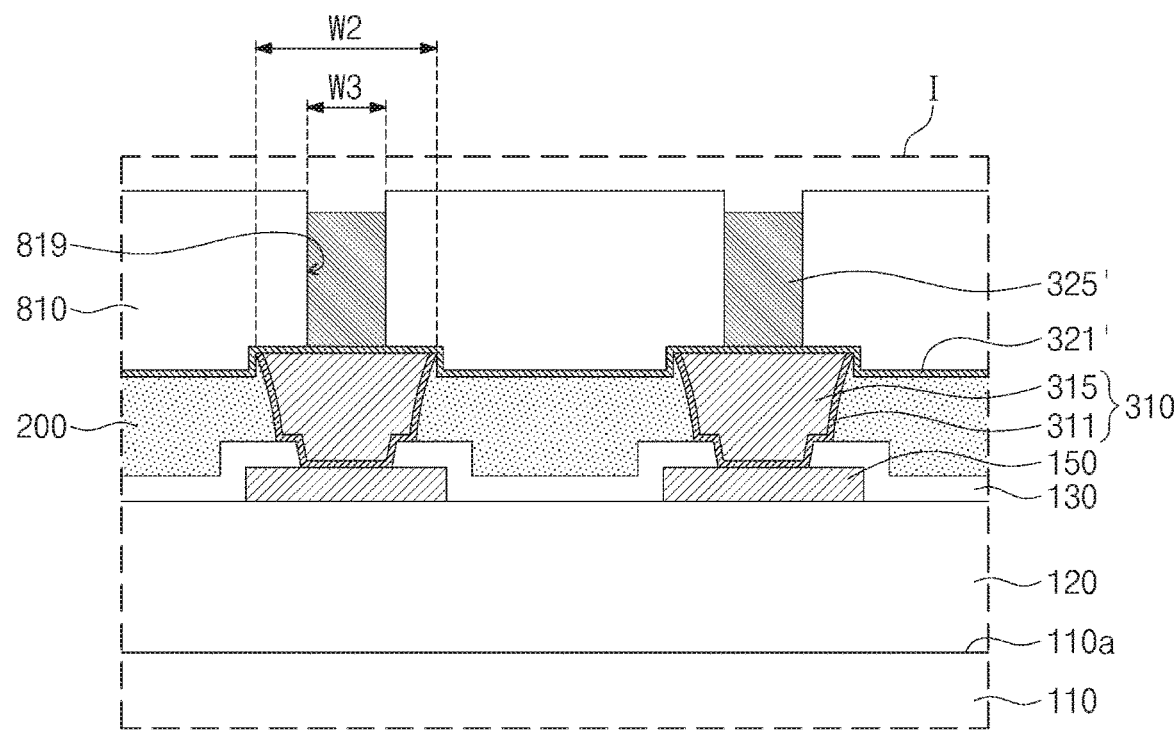

Referring to FIG. 2H, a resist pattern 810 and a preliminary solder portion 325' may be formed on the solder seed layer 321'. In embodiments, the resist pattern 810 may be formed on the solder seed layer 321'. The resist pattern 810 may have a guide opening 819 exposing a portion (a first portion) of the solder seed layer 321'. The preliminary solder portion 325' may be formed in the guide opening 819 by performing an electroplating process using the exposed portion of the solder seed layer 321' as an electrode. The preliminary solder portion 325' may include a solder material, e.g., tin, bismuth, lead, silver, or any alloy thereof. A width W3 of the preliminary solder portion 325' may be less than a width W2 of the top surface 310a of the pillar pattern 310. A diameter of the preliminary solder portion 325' may be less than a diameter of the top surface 310a of the pillar pattern 310.

Figure 2I:
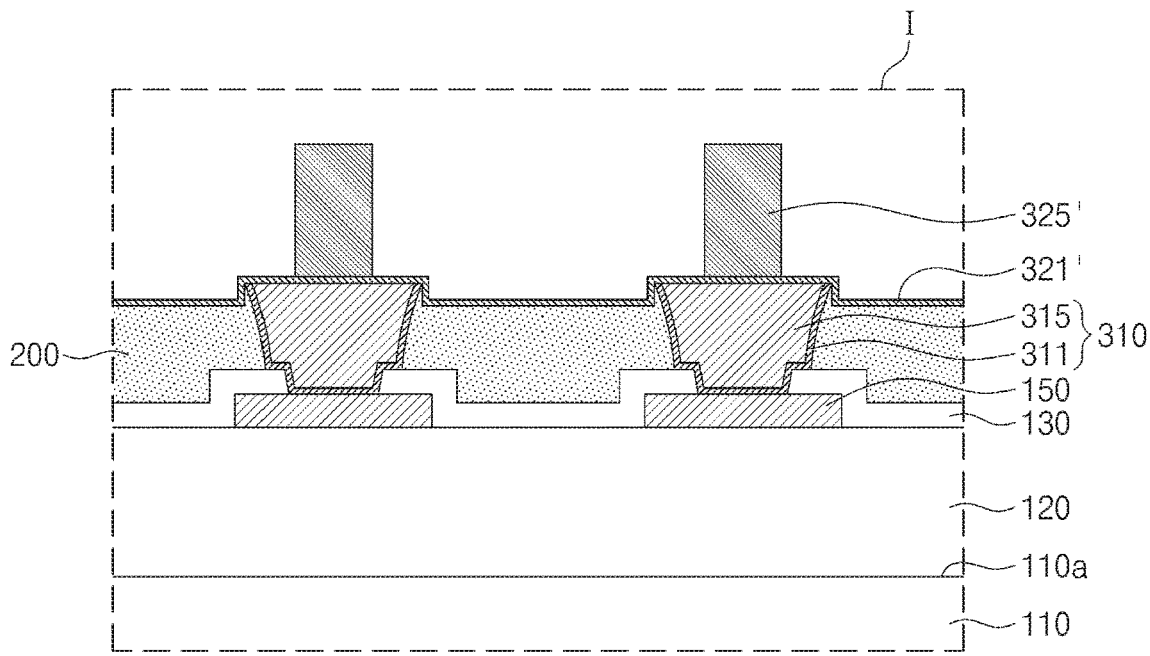

Referring to FIG. 2I, the resist pattern 810 may be removed to expose a top surface of the solder seed layer 321'. The resist pattern 810 may be removed by a strip process.

Figure 2J:
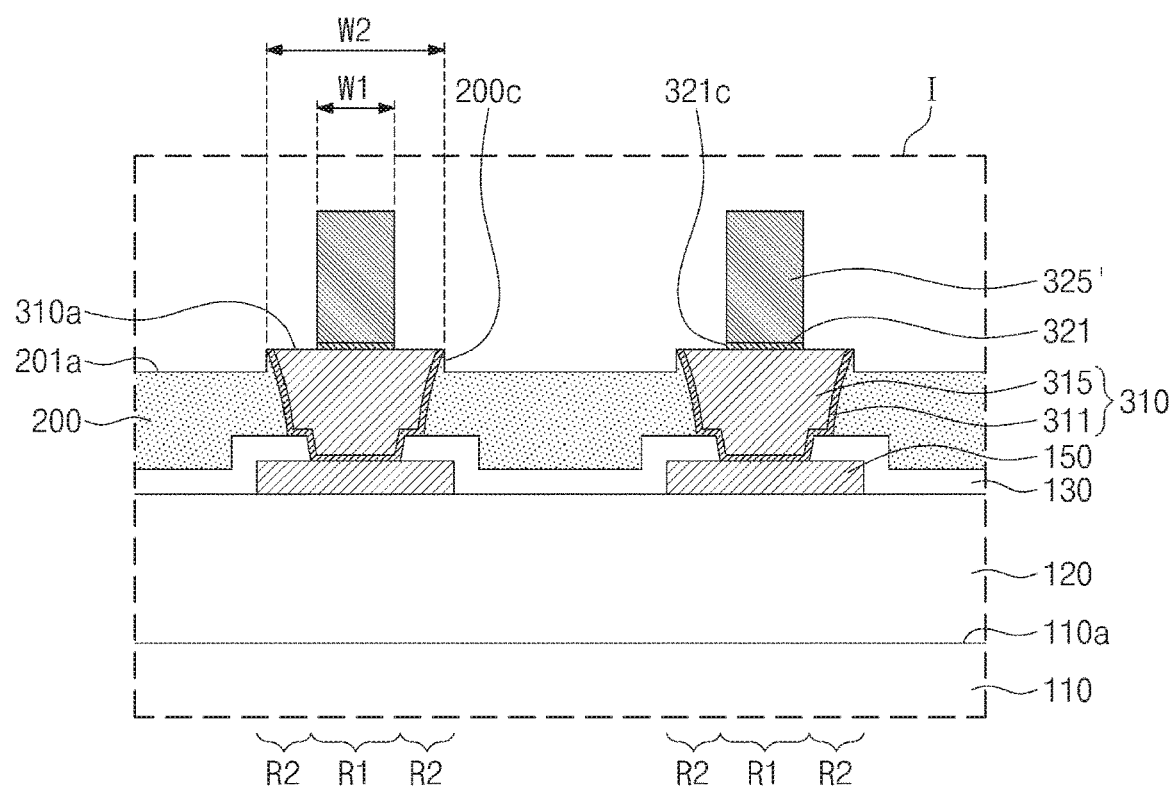

Referring to FIG. 2J, a second portion the solder seed layer 321' remaining from the first portion of the solder seed layer 321' and exposed by the preliminary solder portion 325' may be removed to form a solder seed pattern 321. The solder seed pattern 321 may be formed between the top surface 310a of the pillar pattern 310 and the preliminary solder portion 325'. A width W1 (a first width) of the solder seed pattern 321 (or the preliminary solder portion 325') may be less than the width W2 (a second width) of the top surface 310a of the pillar pattern 310. A diameter of the solder seed pattern 321 may be less than the diameter of the top surface 310a of the pillar pattern 310. The solder seed pattern 321 may cover the top surface 310a of a first region R1 of the pillar pattern 310 but may expose the top surface 310a of a second region R2 of the pillar pattern 310. The solder seed pattern 321 may not extend onto the top surface 201a of the polymer layer 200. The removal of the solder seed layer 321' may be performed by an etching process, for example, a wet etching process. In the etching process, the conductive pattern 315 may have an etch selectivity with respect to the solder seed layer 321'. Thus, after the etching process, the pillar pattern 310 may not be removed but may remain.

Figure 2K:
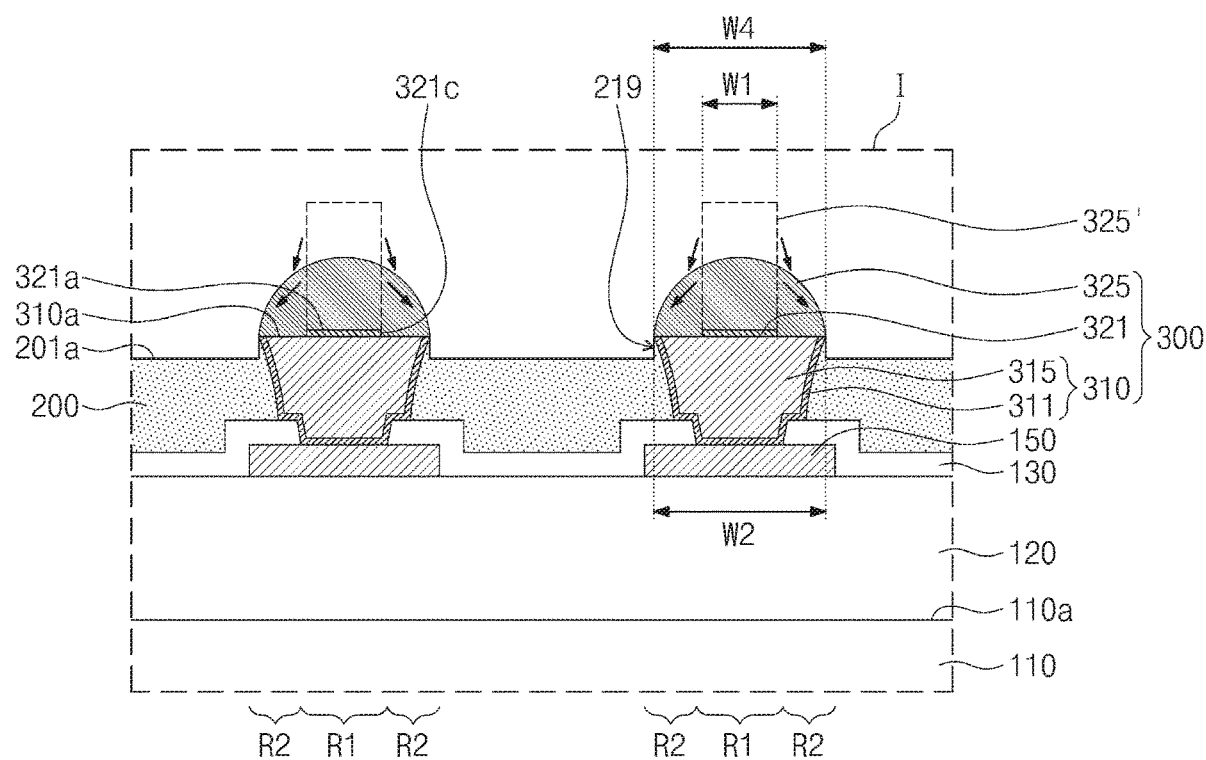

Referring to FIG. 2K, a reflow process may be performed on the preliminary solder portion 325' to form a solder portion 325. The reflow process may be performed at a temperature equal to or higher than a melting point of the preliminary solder portion 325'. During the reflow process, the preliminary solder portion 325' may flow onto the top surface 310a of the second region R2 of the pillar pattern 310 like arrows illustrated in FIG. 2K. Thus, the solder portion 325 may cover the top surface 310a of the second region R2 of the pillar pattern 310 and a top surface 321a and a sidewall 321c of the solder seed pattern 321. In detail, the solder portion 325 may be in physical contact with the top surface 310a of the second region R2 of the pillar pattern 310 and the top surface 321a and the sidewall 321c of the solder seed pattern 321. A maximum diameter of the solder portion 325 may be greater than the diameter of the solder seed pattern 321. A maximum width W4 of the solder portion 325 may be greater than the width W1 of the solder seed pattern 321. For example, the width W1 of the solder seed pattern 321 may range from 20% to 70% of the maximum width W4 of the solder portion 325. If the width W1 of the solder seed pattern 321 is much less than the maximum width W4 of the solder portion 325 (e.g., less than 20% thereof), it may be difficult to form a sufficient solder portion 325. If the width W1 of the solder seed pattern 321 is greater than 70% of the maximum width W4 of the solder portion 325, it may be difficult to seal the solder seed pattern 321 by the solder portion 325. The maximum width W4 of the solder portion 325 may be substantially equal to the width W2 of the top surface 310a of the pillar pattern 310. However, embodiments of the inventive concepts are not limited thereto. The fabrication of the connection terminal 300 of the semiconductor device 1 may be completed by the aforementioned embodiments.

According to the embodiments of the inventive concepts, the solder seed pattern 321 may be formed by the etching process of the solder seed layer 321' as described with reference to FIG. 2J. In the etching process, an undercut may occur at the sidewall 321c of the solder seed pattern 321. If the width W1 of the solder seed pattern 321 is substantially equal to the width W2 of the top surface 310a of the pillar pattern 310, the sidewall 321c of the solder seed pattern 321 may be exposed by the solder portion 325. In this case, the undercut of the solder seed pattern 321 may affect a shape and a size of the connection terminal 300. Electrical/mechanical characteristics of the connection terminal 300 may be deteriorated by the undercut.

However, according to the embodiments of the inventive concepts, the width W1 of the solder seed pattern 321 may be less than the width W2 of the top surface 310a of the pillar pattern 310, and thus the solder portion 325 may cover the sidewall 321c of the solder seed pattern 321. Thus, even though the undercut is formed at the sidewall 321c of the solder seed pattern 321, the solder portion 325 may cover the undercut. Therefore, the undercut may not be exposed to the outside of the connection terminal 300. In other words, the connection terminal 300 having desired shape and size may be formed regardless of whether the undercut of the solder seed pattern 321 is formed or not. As a result, electrical and mechanical characteristics of the connection terminal 300 may be improved. In addition, the connection terminals 300 may have a fine pitch.

In embodiments, wettability of the solder material with respect to the polymer layer 200 may be different from wettability of the solder material with respect to the pillar pattern 310. The solder portion 325 may be selectively formed on the pillar pattern 310 by the wettability difference. For example, the solder portion 325 may not extend onto the polymer layer 200. Because the conductive residue 270 is removed as described with reference to FIG. 2F, it is possible to prevent the solder portion 325 from extending onto the polymer layer 200 by the conductive residue 270. Thus, the connection terminals 300 may have a fine pitch.

The semiconductor device 1 described with reference to FIGS. 1A to 1C may be fabricated by the fabricating method according to the aforementioned embodiments. The semiconductor device 1 may include the semiconductor substrate 110, the circuit layer 120, the conductive pads 150, the connection terminals 300, and the polymer layer 200. The fabrication of the connection terminals 300 may be performed in a wafer level. In embodiments, the fabrication of the connection terminals 300 may be performed in a chip level.

Figure 3:
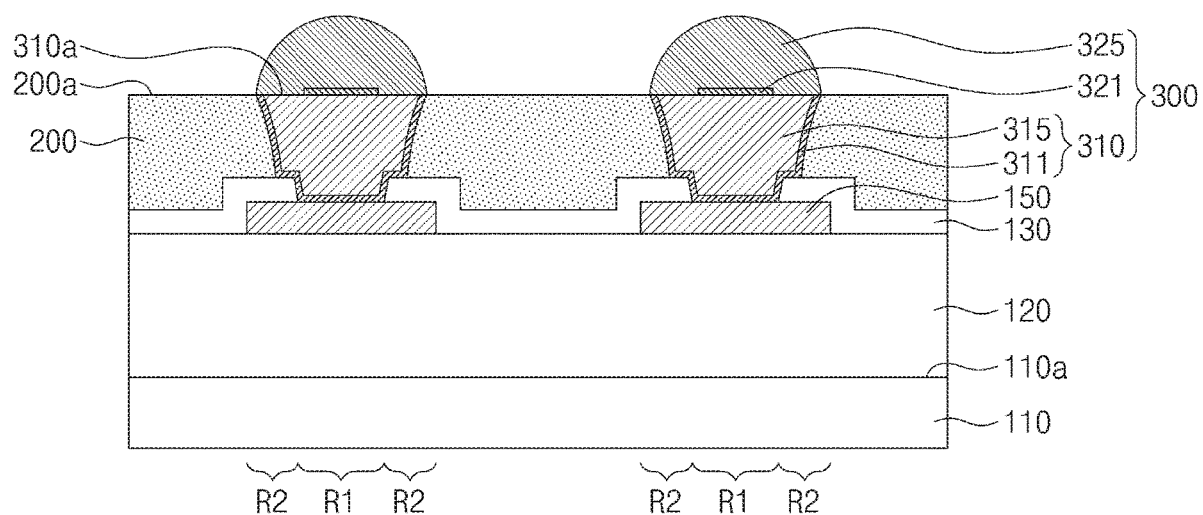
FIG. 3 is a cross-sectional view illustrating a semiconductor device according to embodiments of the inventive concepts.

FIG. 3 is a cross-sectional view illustrating a semiconductor device according to embodiments of the inventive concepts. FIG. 3 corresponds to an enlarged view of the region 1' of FIG. 1A and a cross-sectional view taken along the line II-III of FIG. 1B. Hereinafter, the descriptions to the same elements and/or features as in the above embodiments will be omitted for the purpose of ease and convenience in explanation.

Referring to FIGS. 1A, 1B and 3, a semiconductor device 1A may be fabricated by substantially the same method as described with reference to FIGS. 2A to 2K. However, the etching process of the polymer layer 200, described with reference to FIG. 2F, may be omitted. Thus, a top surface 200a of the polymer layer 200 may be disposed at substantially the same level as the top surface 310a of the pillar pattern 310. The semiconductor device 1A may include the semiconductor chip 100, the connection terminals 300, and the polymer layer 200.

Figure 4:
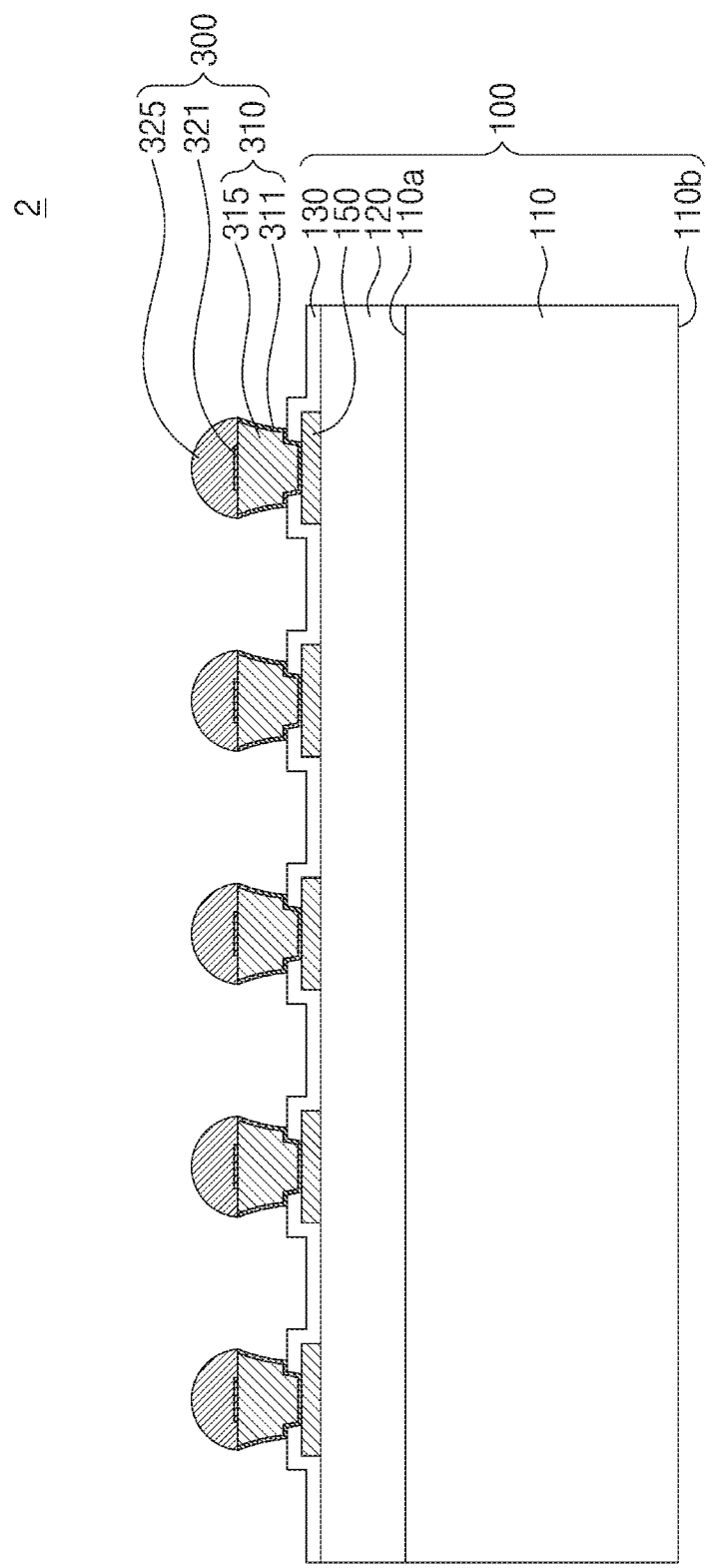
FIG. 4 is a cross-sectional view illustrating a semiconductor device according to embodiments of the inventive concepts.

FIG. 4 is a cross-sectional view illustrating a semiconductor device according to embodiments of the inventive concepts. Hereinafter, the descriptions to the same elements and/or features as in the above embodiments will be omitted for the purpose of ease and convenience in explanation.

Referring to FIG. 4, a semiconductor device 2 may include the semiconductor chip 100 and the connection terminals 300. The semiconductor device 2 may be fabricated by substantially the same method as described with reference to FIGS. 2A to 2K. However, the polymer layer 200 may be further removed to expose the pillar seed pattern 311 and the protective layer 130. The removal of the polymer layer 200 may be performed after the formation of the solder portion 325 of FIG. 2K. The semiconductor chip 100 may include the semiconductor substrate 110, the circuit layer 120, the protective layer 130, and the conductive pads 150. Each of the connection terminals 300 may include the pillar pattern 310, the solder seed pattern 321, and the solder portion 325.

Figure 5:
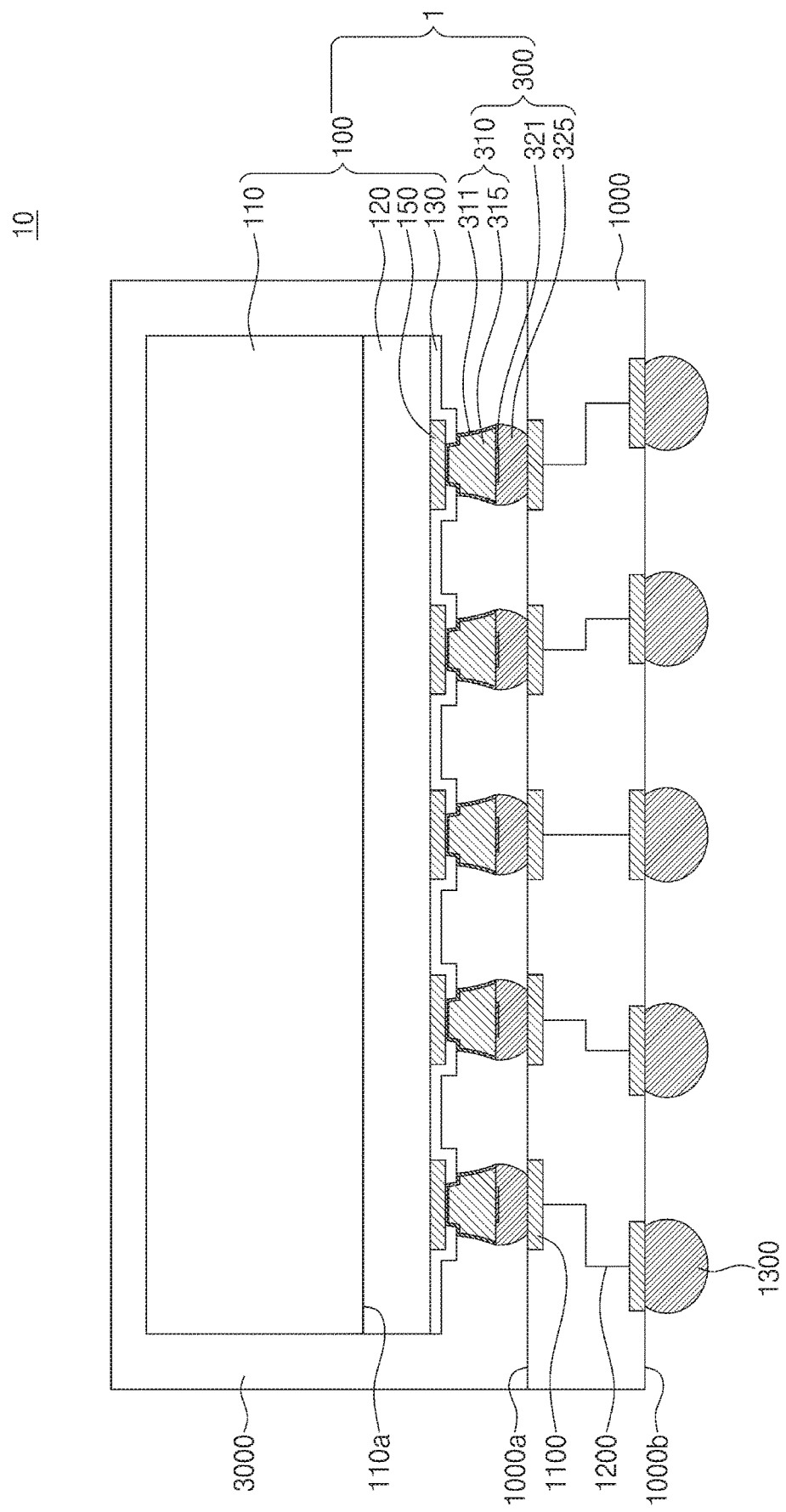
FIG. 5 is a cross-sectional view illustrating a semiconductor package according to embodiments of the inventive concepts.

FIG. 5 is a cross-sectional view illustrating a semiconductor package according to embodiments of the inventive concepts. Hereinafter, the descriptions to the same elements and/or features as in the above embodiments will be omitted for the purpose of ease and convenience in explanation.

Referring to FIG. 5, a semiconductor package 10 may include a package substrate 1000, the semiconductor device 1, and a molding layer 3000. For example, a printed circuit board (PCB) may be used as the package substrate 1000. The package substrate 1000 may have one surface 1000a and another surface 1000b, which are opposite to each other. Metal pads 1100 may be provided on the one surface 1000a of the package substrate 1000. External terminals 1300 may be provided on the other surface 1000b of the package substrate 1000. The external terminals 1300 may be electrically connected to the metal pads 1100 through interconnection lines 1200.

The semiconductor device 1 may be mounted on the one surface 1000a of the package substrate 1000. The semiconductor device 1 may be the same as described with reference to FIGS. 1A to 1C and may be fabricated by the method described with reference to FIGS. 2A to 2K. Alternatively, the semiconductor device 1A of FIG. 3 or the semiconductor device 2 of FIG. 4 may be mounted on the package substrate 1000. In embodiments, the semiconductor device 1 may be disposed on the package substrate 1000 in such a way that the connection terminals 300 are aligned with the metal pads 1100. The connection terminals 300 may be connected to the metal pads 1100, and thus the semiconductor device 1 may be electrically connected to the package substrate 1000. Solder or solder paste may be provided on the metal pad 1100. In this case, the connection terminal 300 may be connected to the metal pad 1100 through a solder ball formed from the solder or solder paste.

The molding layer 3000 may be disposed on the one surface 1000a of the package substrate 1000 to cover the semiconductor device 1. The molding layer 3000 may extend into a gap between the package substrate 1000 and the semiconductor chip 100 to seal or cover the connection terminals 300. The molding layer 3000 may be disposed between the connection terminals 300. The molding layer 3000 may be a polymer layer. The molding layer 3000 may include an insulating polymer such as an epoxy molding compound (EMC). In embodiments, an additional underfill layer may be provided between the package substrate 1000 and the semiconductor chip 100.

In embodiments, a plurality of the semiconductor devices 1 may be stacked on the package substrate 1000. In this case, the semiconductor devices 1 may be electrically connected to each other through the connection terminals 300. In this case, the connection terminals 300 may be provided between the semiconductor devices 1.

According to the embodiments of the inventive concepts, the diameter of the solder seed pattern may be less than the diameter of the pillar pattern, and thus the solder portion may cover the sidewall of the solder seed pattern. Thus, even though the undercut is formed at the sidewall of the solder seed pattern, the undercut may not be exposed to the outside of the connection terminal. As a result, the electrical and mechanical characteristics of the connection terminal may be improved. In addition, the connection terminals may have a fine pitch.

Furthermore, the pillar patterns may have substantially uniform heights by the planarization process of the conductive layer and the pillar seed layer.

While the inventive concepts have been described with reference to example embodiments, it will be apparent to those skilled in the art that various changes and modifications may be made without departing from the spirits and scopes of the inventive concepts. Therefore, it may be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:
1. A semiconductor package comprising:
a package substrate including a metal pad;
a semiconductor substrate vertically spaced apart from on an upper surface of the package substrate;
a conductive pad disposed on a lower surface of on the semiconductor substrate;
a protective layer disposed on the lower surface of on the semiconductor substrate and covering a side surface of the conductive pad and a first portion of a lower surface of the conductive pad, the protective layer having a pad opening exposing a second portion of the lower surface of the conductive pad;
a pillar pattern disposed in the pad opening and being in contact with the second portion of the lower surface the conductive pad;
a solder pattern disposed between the pillar pattern and the metal pad and electrically connected to the metal pad, the solder pattern comprising a solder seed pattern and a solder portion; and
a polymer layer being in physical contact with the upper surface of the package substrate, a lower sidewall of the pillar pattern, the protective layer, and at least a portion of a side surface of the semiconductor substrate,
wherein the lower sidewall of the pillar pattern is inclined to a top surface of the pillar pattern,
wherein a first lower surface of the protective layer on the lower surface of the semiconductor substrate is at a level different from a second lower surface of the protective layer on the first portion of a lower surface of the conductive pad, and
wherein the solder pattern comprises:
a metal material including at least one of copper and titanium and spaced apart from an edge portion of the pillar pattern; and a solder material including at least one of tin, bismuth, lead, and silver, and in contact with the edge portion of the pillar pattern.

2. The semiconductor package of claim 1, wherein the wherein the protective layer has a stair-stepped structure.

3. The semiconductor package of claim 1, wherein the package substrate includes printed circuit board.

4. The semiconductor package of claim 1, further comprising:
an external terminal on a bottom surface of the package substrate,
wherein the package substrate further includes an interconnection pattern therein, and
wherein the interconnection pattern redistributes the external terminal from the conductive pad.

5. The semiconductor package of claim 1, wherein an upper portion of the pillar pattern is surrounded by the protective layer, and
wherein a lower portion of the pillar pattern is surrounded by the polymer layer, and has the lower sidewall.

6. The semiconductor package of claim 5, wherein a width of the upper portion of pillar pattern surrounded by the protective layer is the same as or less than a width of the lower portion of the pillar pattern surrounded by the polymer layer.

7. The semiconductor package of claim 6, wherein the lower portion of the pillar pattern surrounded by the polymer layer has a tapered shape.

8. The semiconductor package of claim 1, wherein the solder seed pattern of the solder pattern comprises copper; and
wherein the solder portion of the solder pattern comprises the solder material.

9. The semiconductor package of claim 1, wherein sidewalls of the solder pattern do not physically contact the polymer layer.

10. A semiconductor package comprising:
a package substrate including an interconnection pattern therein;
a metal pattern on an upper surface of the package substrate and electrically connected to the interconnection pattern, the metal pattern comprising at least one metal pad;
a semiconductor substrate vertically spaced apart from on the upper surface of the package substrate;
a conductive pad disposed on a lower surface of on the semiconductor substrate;
a protective layer disposed on the lower surface of the semiconductor substrate and covering a side surface of the conductive pad and an edge portion of a lower surface of the conductive pad, the protective layer having a pad opening exposing a center portion of the lower surface of the conductive pad;
a connection terminal between the conductive pad and the metal pattern; and
a polymer layer disposed between the package substrate and the protective layer,
wherein the connection terminal comprises:
a pillar pattern disposed in the pad opening and being in contact with the center portion of lower surface the conductive pad; and
a solder pattern being in contact with the metal pattern and provided between the metal pattern and the pillar pattern,
wherein a width of a lower portion of the pillar pattern is greater than a width of a upper portion of the pillar pattern,
and
wherein the solder pattern includes:
a solder seed pattern including copper and spaced apart from an edge portion of a lower surface of the pillar pattern; and
a solder material including at least one of tin, bismuth, lead, and silver, and in contact with the edge portion of the lower surface of the pillar pattern.

11. The semiconductor package of claim 10, wherein the upper portion of the pillar pattern is surrounded by the protective layer, and
wherein the lower portion of the pillar pattern is surrounded by the polymer layer.

12. The semiconductor package of claim 11, wherein the lower portion of the pillar pattern has an inclined sidewall.

13. The semiconductor package of claim 10, wherein the protective layer has:
a first lower surface on the lower surface of on the semiconductor substrate; and
a second lower surface on the edge portion of the lower surface the conductive pad,
wherein the first lower surface is provided at a higher level than the second lower surface.

14. The semiconductor package of claim 10, wherein the polymer layer further extends on a sidewall of the semiconductor substrate.

15. The semiconductor package of claim 10, wherein the protective layer includes at least one of silicon oxide, silicon nitride, silicon oxynitride, and tetraethyl orthosilicate.

16. The semiconductor package of claim 10, further comprising
an external terminal disposed on a bottom surface of the package substrate and being not vertically aligned with the conductive pad,
wherein the interconnection pattern redistributes the external terminal from the conductive pad.

17. The semiconductor package of claim 10, wherein the package substrate includes printed circuit board.

* * * * *